United States Patent
Kasuga et al.

(10) Patent No.: US 8,161,333 B2
(45) Date of Patent: Apr. 17, 2012

(54) INFORMATION PROCESSING SYSTEM

(75) Inventors: Kazunori Kasuga, Kawasaki (JP);
Yoshinori Mesaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 57 days.

(21) Appl. No.: 12/613,932

(22) Filed: Nov. 6, 2009

(65) Prior Publication Data

US 2010/0169726 A1    Jul. 1, 2010

(30) Foreign Application Priority Data

Dec. 26, 2008   (JP) .................... 2008-333910

(51) Int. Cl.
*G11C 29/50*   (2006.01)
*G11C 29/54*   (2006.01)

(52) U.S. Cl. ...................... 714/721; 714/733

(58) Field of Classification Search .......... None
See application file for complete search history.

(56) References Cited

U.S. PATENT DOCUMENTS

| | | | |
|---|---|---|---|
| 6,483,764 B2 | 11/2002 | Hsu et al. | |
| 6,978,406 B2 * | 12/2005 | Stong et al. | 714/718 |
| 2007/0030747 A1 | 2/2007 | Hirai et al. | |
| 2007/0198786 A1 | 8/2007 | Bychkov et al. | |

FOREIGN PATENT DOCUMENTS

| | | | |
|---|---|---|---|
| JP | 63146138 A | * | 6/1988 |
| JP | 06-052694 A | | 2/1994 |
| JP | 6-333387 A | | 12/1994 |
| JP | 2002-269979 A | | 9/2002 |
| JP | 2007-48347 A | | 2/2007 |

OTHER PUBLICATIONS

European Search Report dated Mar. 4, 2010, issued in corresponding European Patent Application No. 09180239.7.
Korean Office Action dated Apr. 20, 2011, issued in corresponding Korean Patent Application No. 10-2009-0117048.
European Office Action dated Feb. 14, 2011, issued in corresponding European Patent Application No. 09 180 239.7.

* cited by examiner

*Primary Examiner* — Jeffrey A Gaffin
*Assistant Examiner* — Dipakkumar Gandhi
(74) *Attorney, Agent, or Firm* — Westerman, Hattori, Daniels & Adrian, LLP

(57) ABSTRACT

An information processing system includes a dynamic random access memory, a processor for information processing in cooperation with the dynamic access memory, and a built-in diagnosis module including a longevity evaluation device, the longevity evaluation device comprising, a timer for measuring an elapsed time after data is entered into a memory device, a read controller for reading the data from the memory device when the elapsed time reaches a predetermined time, and an evaluator for evaluating a longevity of the memory device based on an existence of an error in the data read by the read controller and the elapsed time.

15 Claims, 16 Drawing Sheets

INFORMATION PROCESSING SYSTEM

CROSS-REFERENCE TO RELATED APPLICATION

This application is based upon and claims the benefit of priority of the prior Japanese Patent Application No. 2008-333910 filed on Dec. 26, 2008, the entire contents of which are incorporated herein by reference.

FIELD

An aspect of the embodiments discussed herein is directed to an information processing system.

BACKGROUND

DRAMs (Dynamic Random Access Memories) are volatile memories and have a structure of storing information in capacitors in memory cells. Therefore, with the passage of time after data have been written in the cells, electric charge will leak and information will be lost. Accordingly, the data written in there are refreshed within a fixed time.

For example, the data retention time guaranteed for 512 Mbit DDR SDRAMs is generally 64 ms, and to maintain data, a refresh operation needs to be performed within 64 ms for 32768 ROW lines.

In addition, semiconductor devices, such as DRAMs, have limited longevities to carry current and their functional characteristics deteriorate as the current carrying time increases. Eventually, semiconductor devices will become unable to satisfy guaranteed standard values and reach the end of their longevities.

One of the characteristics which is related to deterioration of DRAMs is data retention time. DRAMs have a sufficient margin for their guaranteed standard values of the data retention time immediately after they start carrying current; however, the margin becomes smaller as the current carrying time increases, and DRAMs reach the end of their longevities when their data retention time becomes shorter than the guaranteed standard value.

Prior arts related to the present invention include technologies disclosed in the following patent documents. Accordingly, Japanese Laid-open Patent Publication No. 06-333387 discusses a technique that a refresh period monitor circuit for DRAM performs selecting a refresh cycle on the basis of the decision result of a refresh period decision unit. Japanese Laid-open Patent Publication No. 2002-269979 discusses a technique that a semiconductor substrate including a plurality of memory cells performs setting a refresh period of the memory cell monitoring the information holding voltage. Japanese Laid-open Patent Publication No. 2007-48347 discusses a technique that a data recording device including a memory cell array performs refreshing at a time interval which is shorter than a data hold time.

SUMMARY

An information processing system includes a dynamic random access memory, a processor for information processing in cooperation with the dynamic access memory, and a built-in diagnosis module including a longevity evaluation device, the longevity evaluation device comprising, a timer for measuring an elapsed time after data is entered into a memory device, a read controller for reading the data from the memory device when the elapsed time reaches a predetermined time, and an evaluator for evaluating a longevity of the memory device based on an existence of an error in the data read by the read controller and the elapsed time.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

As described previously, replacement is necessary when DRAMs have reached the end of their longevities. However, since the need for replacement is found only after errors caused by data inconsistency are detected on computer systems, the reliability of computer systems temporarily may deteriorate.

Hereafter, an embodiment of the present invention will be described with reference to the drawings.

Figure 1:
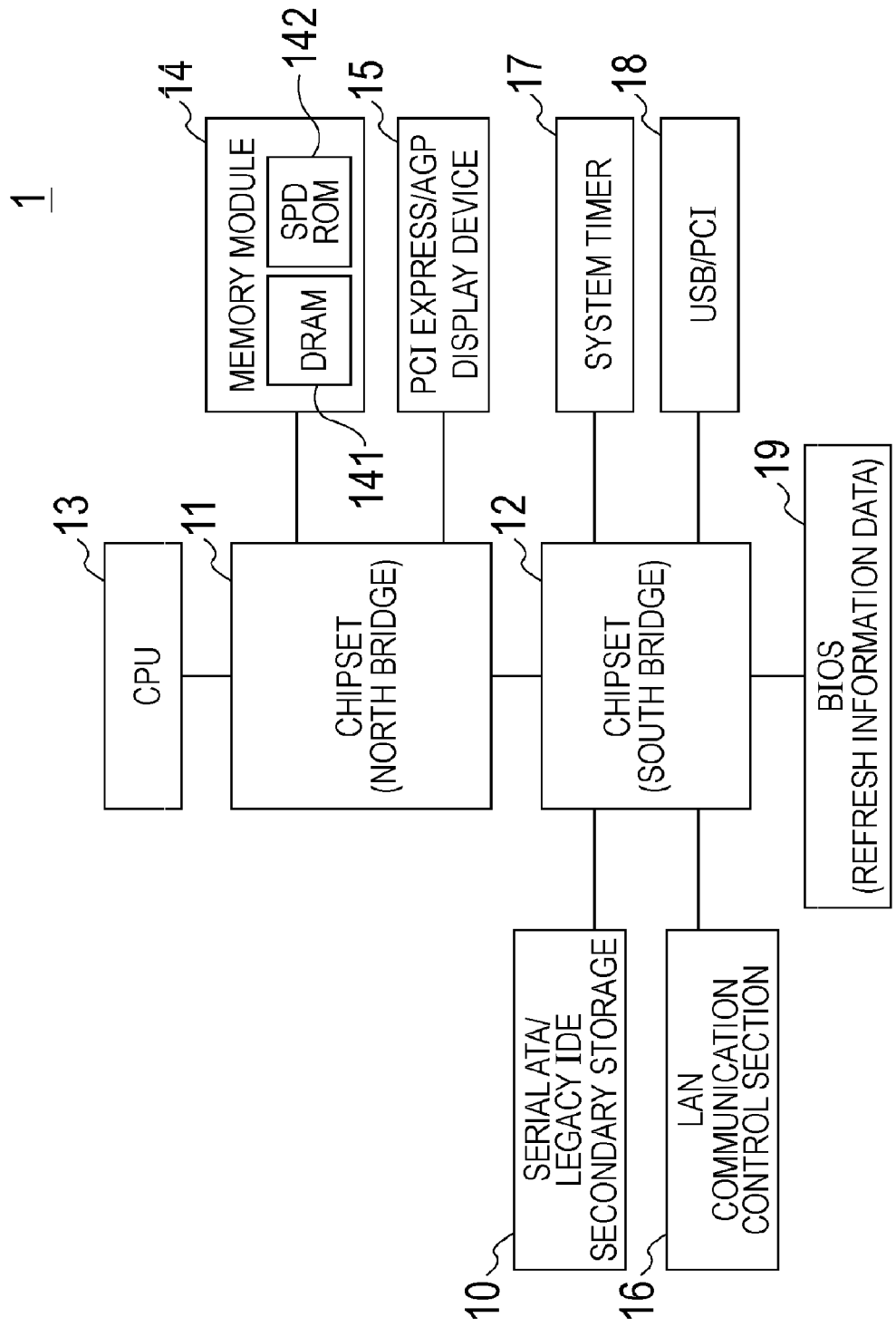
FIG. 1 is a schematic diagram of a longevity evaluation device.
Figure 2:
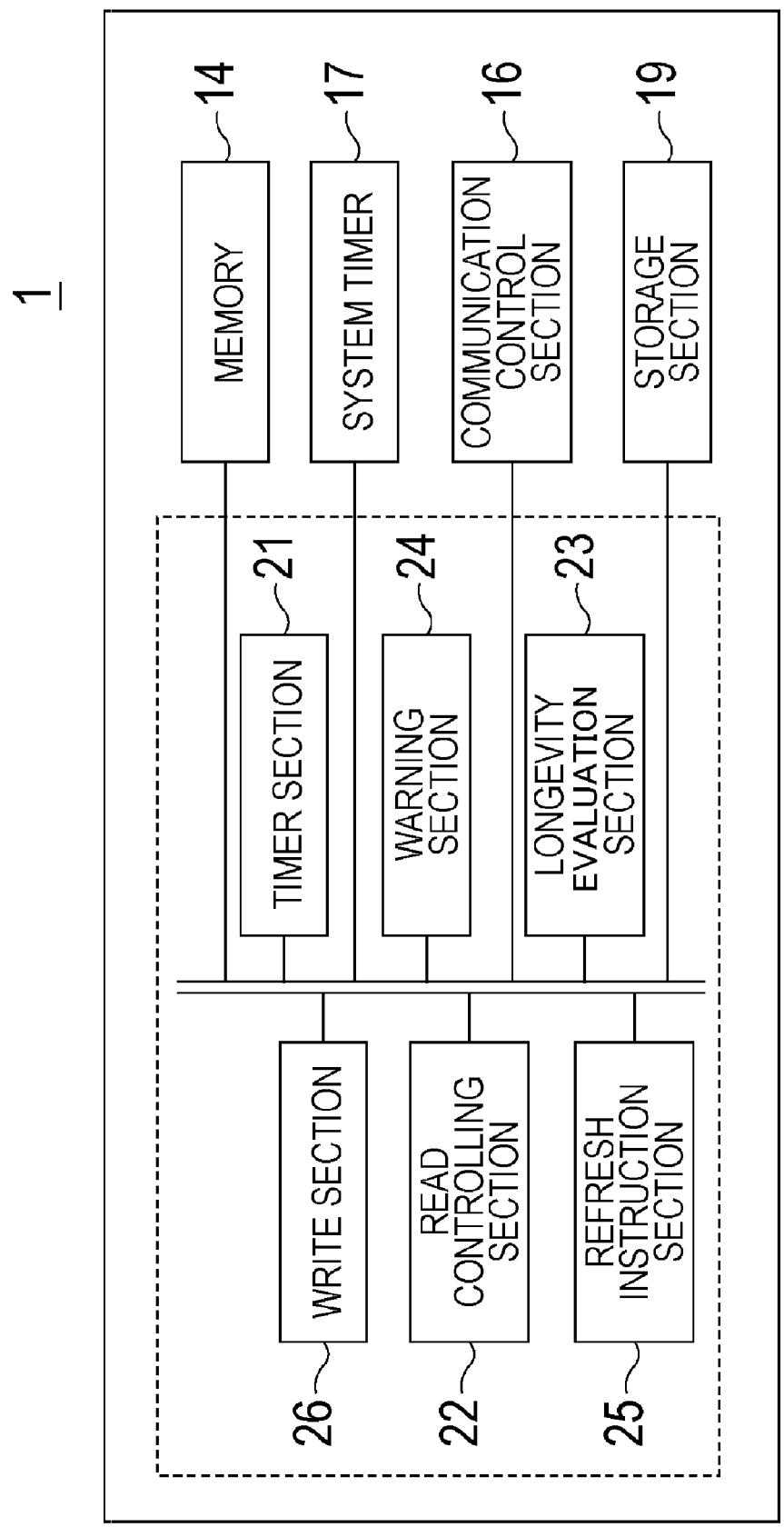
FIG. 2 is a functional block diagram of the longevity evaluation device.

FIG. 1 illustrates a longevity evaluation device of a memory according to this embodiment, and FIG. 2 is a functional block diagram of the longevity detection device.

As illustrated in FIG. 1, a longevity evaluation device 1 is an information processing system (computer) including a memory module 14 which functions as a primary storage and a CPU 13 which functions as a central arithmetic unit. A memory module 14 according to this embodiment includes a DRAM 141 and an SPD (Serial Presence Detect) ROM 142. A volatile memory in the memory module 14 is not limited only to a DRAM, but may be any volatile memory whose data retention time becomes shorter in connection with the current carrying time.

The longevity evaluation device 1 also includes a CPU 13, a chipset (North Bridge) 11 for providing high speed communication and control functions with a memory module 14 and the like, and a chipset (South Bridge) 12 connected to the chipset 11. The chipset 11 includes a graphic circuit and displays processing results and the like of the CPU 13 on a display device 15 connected to the graphic circuit.

Moreover, the longevity evaluation device 1 includes a system timer 17 for calculating a current date and time on the basis of the time obtained from a real-time clock and a USB/PCI interface 18 for interfacing with USB compatible devices or PCI bus compatible devices. In addition, the longevity evaluation device 1 also includes a communication control section, such as a LAN interface 16, for interfacing with a network board and allowing communication with external devices. Moreover, the longevity evaluation device 1 includes a secondary storage (storage section) 10 and a BIOS ROM 19 for storing a program group (BIOS) to control basic input/output operations with peripheral devices and a longevity evaluation program.

The secondary storage 10 according to this embodiment is a magnetic storage device connected to the chipset 12, in which an operating system (OS) and application software are installed.

The CPU 13 properly reads and performs programs, such as the BIOS, the OS, and the longevity evaluation program from the BIOS ROM 19 or the storage section 10 and processes information input from the USB/PCI interface 18, a control section (the LAN interface 16 in this embodiment), and the like, and information read from the secondary storage (storage section) 10. Thereby, the CPU 13 also functions as a timer section 21, a read control section 22, a longevity evaluation section 23, a warning section 24, a refresh instruction section 25, and a write section 26.

The CPU 13 as the timer section 21 measures the elapsed time after data is entered into the memory module 14. Since the memory module 14 according to this embodiment is a DRAM, the data is periodically refreshed after the data is written into the memory module 14. In addition, the electric charge of each cell is returned to a fixed level when reading data. Therefore, the elapsed time after data is entered means the time elapsed after writing, reading, or refreshing the data the last time.

The CPU 13 as the read control section 22 sends a read command as well as an address to be accessed to the memory module 14 and reads data from the address in the memory module 14. The read control section 22, when measuring the longevity of the memory module 14, refers to the timer section 21 to control to read data at a predetermined elapsed time.

The CPU 13 as the longevity evaluation section 23 evaluates the longevity of the memory module 14 based on existence of an error in the read data and the elapsed time. In this embodiment, existence of an error is determined by comparing written data with read data. An error is determined not to exist when the data match, and an error is determined to exist when they do not match. In addition to this method, existence of an error may be determined by writing data as well as check bits into the row in the memory cell to be measured. In this case, an error is determined not to exist when the data and the check bits are consistent and an error is determined to exist when they are not consistent.

The CPU 13 as the warning section 24 outputs a warning message to a predetermined output destination when the end of the longevity is approaching or when the end of the longevity has been reached. In this embodiment, the predetermined output destination includes, for example, the display device 15, a predetermined IP address, a predetermined e-mail address, or the secondary storage (storage section) 10.

The CPU 13 as the refresh instruction section 25 periodically sends a refresh instruction to the memory module 14 to perform a refresh operation.

The CPU 13 as the write section 26 sends a write command as well as data to the memory module 14 to write the data.

The longevity evaluation device 1 according to this embodiment is a device which executes the longevity evaluation program by the CPU 13 and achieves the functions of the above-described sections 21 to 26 by software; however, the longevity evaluation device 1 is not limited thereto, and may be electronic equipment including electronic circuits (hardware) designed to be used as the timer section 21, the read control section 22, the longevity evaluation section 23, the warning section 24, the refresh instruction section 25, or the write section 26.

Figure 3:
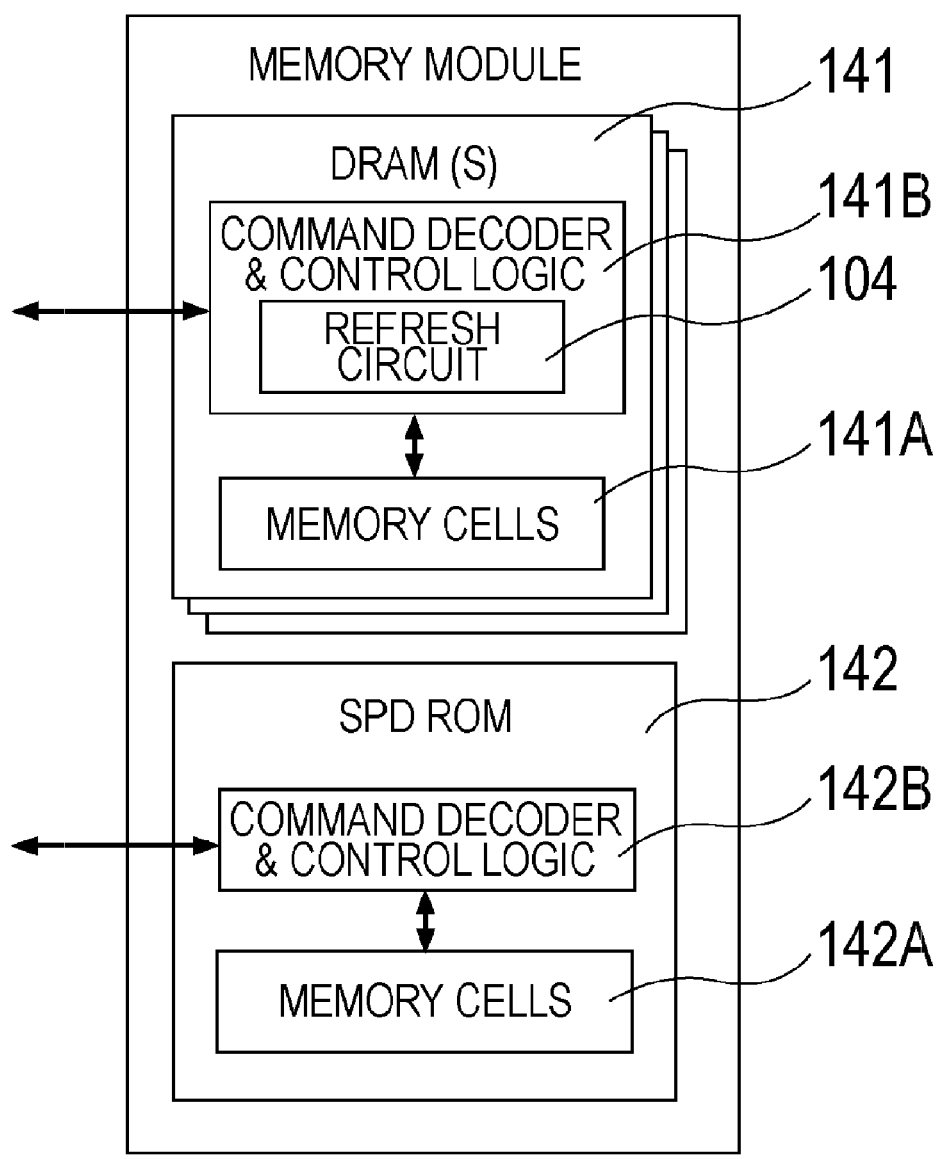
FIG. 3 is a schematic diagram of a memory module.

FIG. 3 is a schematic diagram of the memory module 14. The memory module 14 includes the DRAM 141 for storing data and an SPD ROM 142 for storing information specific to the memory module. The DRAM 141 includes a cell array 141A with cells arranged in a matrix form and a memory control section 141B for controlling read/write operations of data. The SPD ROM 142 includes a cell array 142A with cells arranged in a matrix form and a memory control section 142B for controlling read/write operations of data.

When data and a command to write data are sent from the write section 26 to the memory module 14, the memory control section 141B in the DRAM 141 selects a cell in the cell array 141A on the basis of an address datum included in the command to store the data.

When a command to read data is sent from the read control section 22 to the memory module 14, the memory control section 141B in the DRAM 141 selects a cell in the cell array 141A on the basis of an address datum included in the command to send the read data to the CPU 13.

When a refresh instruction is sent from the refresh instruction section 25 to the memory module 14, a refresh circuit 104 in the memory control section 141B in the DRAM 141 performs a refresh operation.

The longevity evaluation method performed according to the longevity evaluation program by the longevity evaluation device 1 of this embodiment will be described next.

Figure 4:
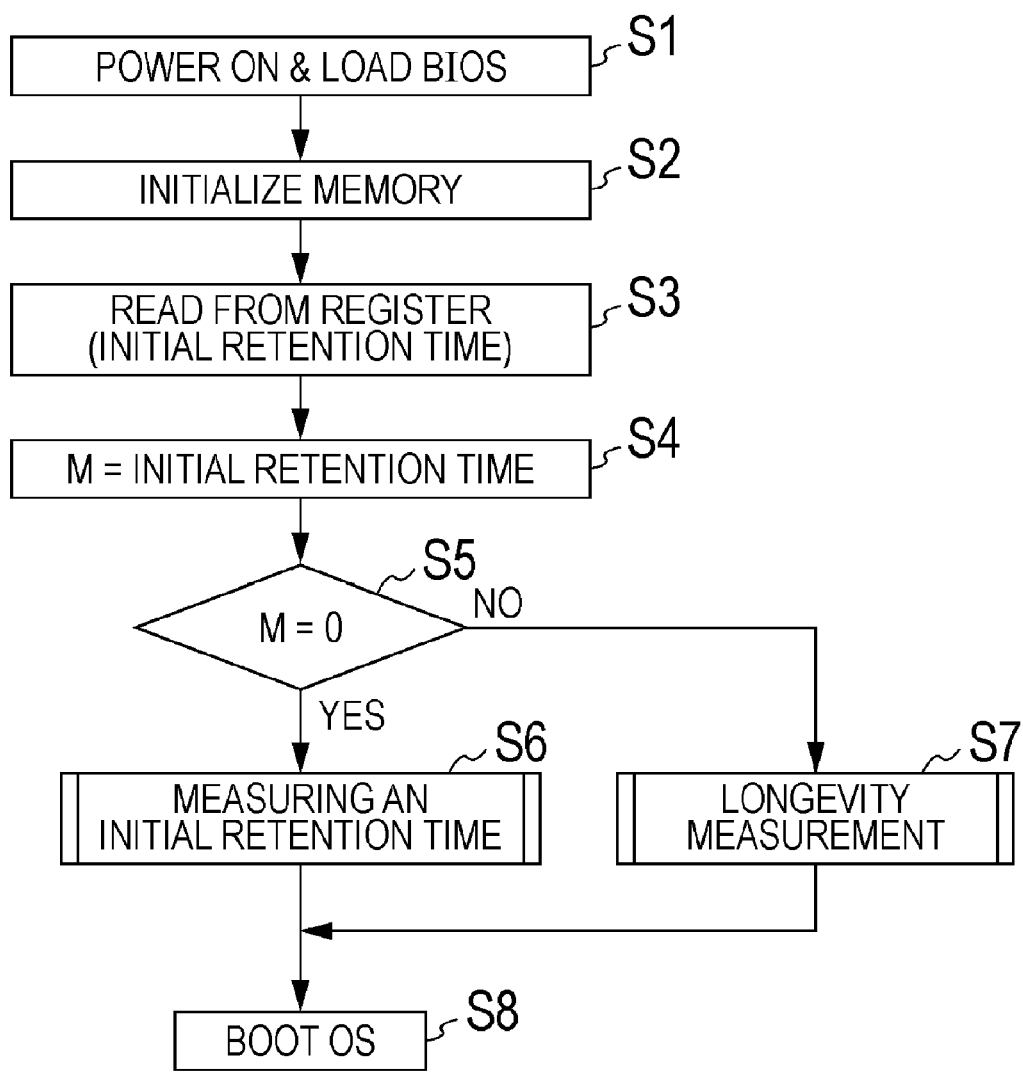
FIG. 4 is a diagram of a longevity evaluation method.

FIG. 4 is a diagram illustrating the longevity evaluation method performed according to the longevity evaluation program by the longevity evaluation device of this embodiment.

When the longevity evaluation device 1 is turned on, the CPU 13 reads the BIOS from the BIOS ROM 19 (S1) and initializes the memory module 14 (S2).

Next, the CPU 13 reads an initial data retention time (Initial Retention Time) from a predetermined storage section (S3). The storage section may include the BIOS ROM 19, the SPD ROM 142, the magnetic storage device (storage section) 10, or a flash memory, such as a USB memory and a memory card (not illustrated). In this embodiment, data is stored in the BIOS ROM 19.

The CPU 13 substitutes the initial retention time into a variable M (S4) and determines whether or not the initial retention time has been registered by checking whether or not the variable M is 0 (S5). More specifically, when the variable M is 0 (S5: Yes), the procedure shifts to S6 to perform a registration process of the initial retention time, and when the variable M is not 0 (S5: No), the procedure shifts to S7 to evaluate the longevity. When the registration process of the initial retention time (S6) or the measuring process of the longevity (S7) is complete, the CPU 13 boots the OS.

Figure 5:
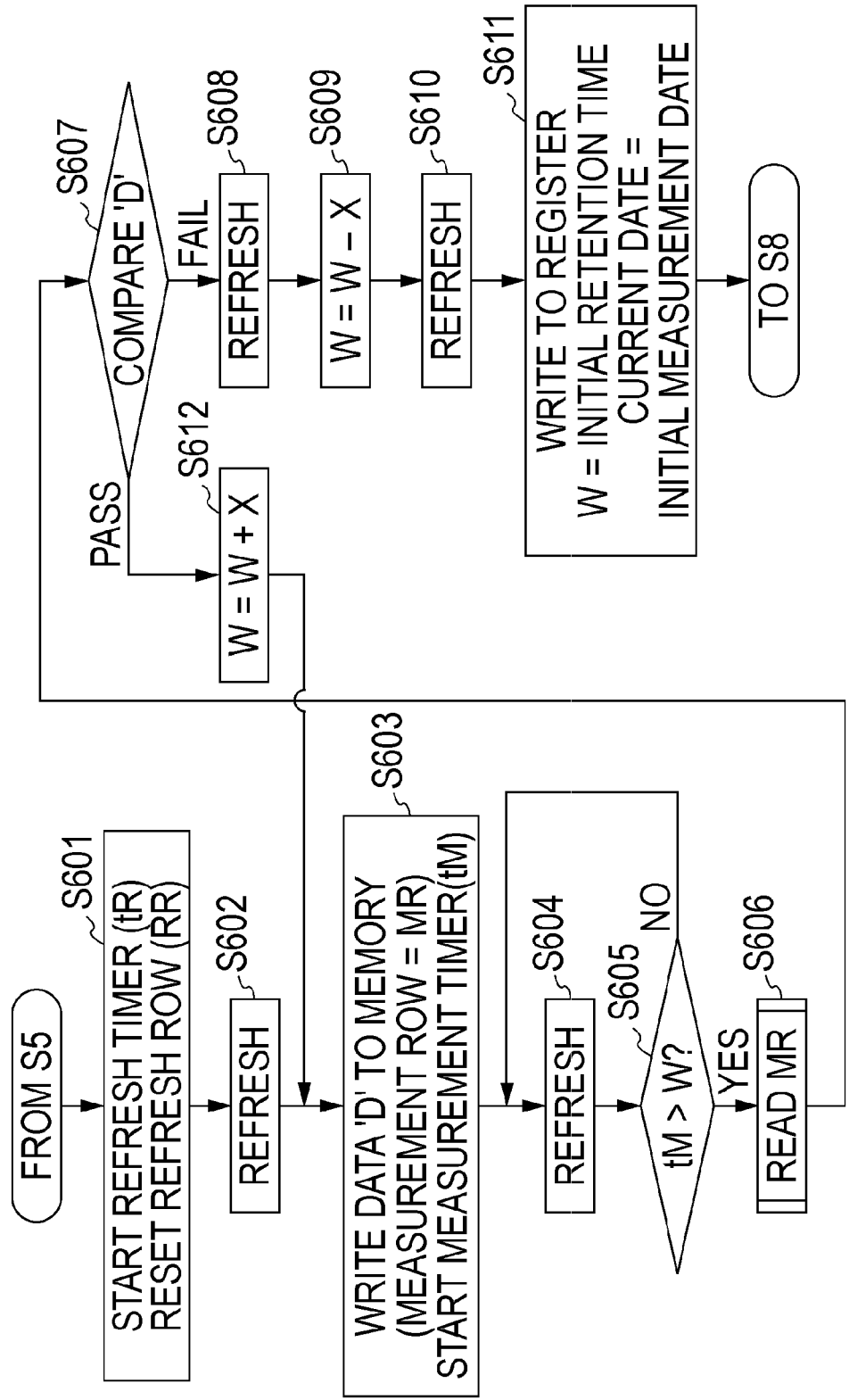
FIG. 5 illustrates a registration process of an initial retention time.

FIG. 5 illustrates the registration process of the initial retention time (S6).

When the variable M is 0 at S5, the timer section 21 starts a refresh timer to measure a refresh interval tR. The refresh instruction section 25 resets a value indicating a row in a cell to be refreshed in the memory module 14 (RR: Refresh Row) to its initial value (S601).

The refresh instruction section 25 refreshes the row which reached the refresh interval tR (S602). In this embodiment, since the memory module 14 is a main storage, data used by the CPU 13 is stored at rows other than the row to be measured. Therefore, the refresh instruction section 25 periodically refreshes rows other than the row to be measured MR in the memory module 14. The details of the refresh operation will be described later.

Next, the write section 26 writes data D into the memory module 14. The timer section 21 starts a measurement timer to measure an elapsed time tM (S603).

The refresh instruction section 25 refreshes a row which reached the refresh interval tR (S604).

The read control section 22 decides whether the elapsed time tM has reached a predetermined time W (S605). When the predetermined time W has not been reached (S605: No), the procedure returns to S604, and when the predetermined time W has been reached (S605: Yes), the data D is read (S606).

The longevity evaluation section 23 compares the value written at S603 with the value read at S606 (S607). When the values match (S607: pass), the predetermined elapsed time W is incremented and the procedure returns to S603. In short, in this embodiment, a minimum time is set in advance as a predetermined elapsed time W, and a predetermined increment X is added and the comparison is repeated when data may be correctly read after the time has passed.

When the values do not match at S607, after refreshment (S608), the longevity evaluation section 23 subtracts the increment X from the elapsed time W and calculates the initial retention time (S609). After refreshment (S610), the longevity evaluation section 23 stores the initial retention time and a measurement date in the BIOS ROM 19 (S611) and the procedure returns to S8 in FIG. 4.

Figure 6:
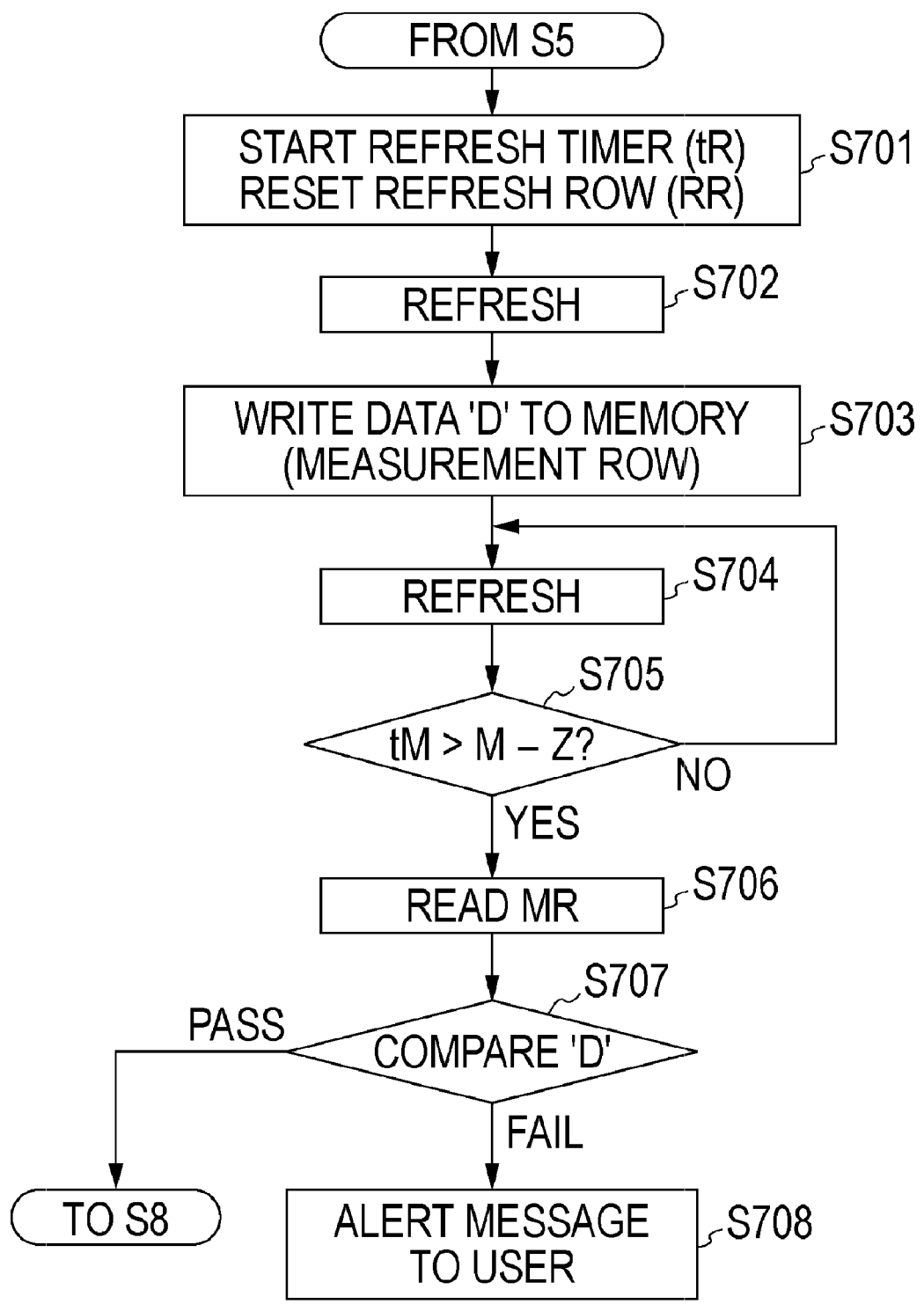
FIG. 6 illustrates an evaluation process of longevity.

FIG. 6 illustrates a evaluation process (S7) of the longevity.

When the variable M is not 0 at S5, the timer section 21 starts the refresh timer to measure the refresh interval tR. The refresh instruction section 25 resets a value indicating a row in a cell to be refreshed in the memory module 14 (RR: Refresh Row) to its initial value (S701).

After refreshment (S702), the write section 26 writes the data D into the memory module 14. The timer section 21 starts the measurement timer to measure the elapsed time tM (S703).

After refreshment (S704), the read control section 22 decides whether the elapsed time tM has reached a base time M-Z obtained by subtracting a threshold (time) Z from the initial retention time M (S705). When the base time M-Z has not been reached (S705: No), the procedure returns to S704, and when the base time M-Z has been reached (S705: Yes), the data D is read (S706).

The longevity evaluation section 23 compares the value written at S703 with the value read at S706 (S707). When the values match (S707: pass), the longevity evaluation section 23 evaluates that the end of the longevity has not been reached and the procedure shifts to S8.

On the other hand, when the values do not match at S707, the longevity evaluation section 23 evaluates that the end of the longevity has been reached, and the warning section 24 outputs a warning message accordingly (708).

Figure 7:
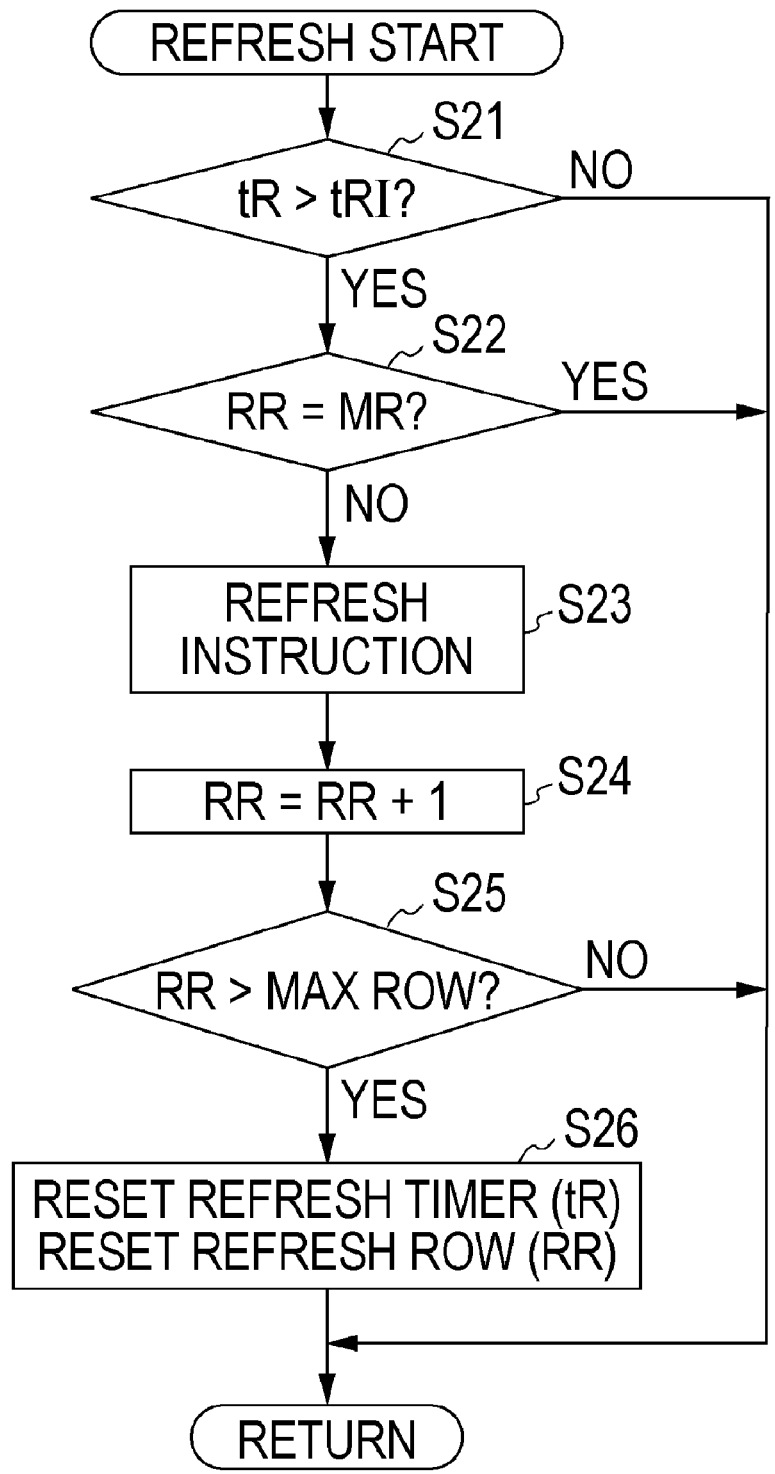
FIG. 7 is a diagram of a refresh process.

FIG. 7 is a diagram illustrating a refresh process of S602, 604, 608, 610, 702, and 704.

The refresh instruction section 25 decides whether the refresh interval tR has reached a predetermined value tRI (S21). When the value has not been reached, the refresh instruction section 25 exits the refresh process at FIG. 7 and returns to the process in FIG. 5 or 6 since there is no need for refreshment.

On the other hand, when the refresh interval tR has reached the predetermined value tRI, the refresh instruction section 25 decides whether the row to be refreshed is the same as the row to be measured (S22). When the rows are not the same (S22: No), the refresh instruction section 25 sends a refresh instruction (S23).

After the refresh instruction, the refresh instruction section 25 increments the value RR which indicates the row to be refreshed by one (S24), and determines whether the row to be refreshed has reached the last row (S25).

In the case that the refresh instruction section 25 has determined that the row to be refreshed has reached the last row (S25: Yes), the refresh instruction section 25 resets the refresh interval tR of the refresh timer and the row to be refreshed RR to their initial values (S26). In the case that the refresh instruction section 25 has determined that the row to be refreshed has not reached the last row (S25: No), the refresh instruction section 25 does not trigger a reset and exits the refresh process in FIG. 7 and returns to the process in FIG. 5 or 6.

In S22, in the case that the row to be refreshed is the same as the row to be measured, the refresh instruction section 25 prohibits a refresh operation and exits the refresh process (S22: Yes). In other words, if the longevity evaluation section 23 periodically refreshes a row to be measured which is waiting to reach the predetermined elapsed time, the data retention time may not be measured; therefore, a refresh operation is performed avoiding the row to be measured.

Figure 8:
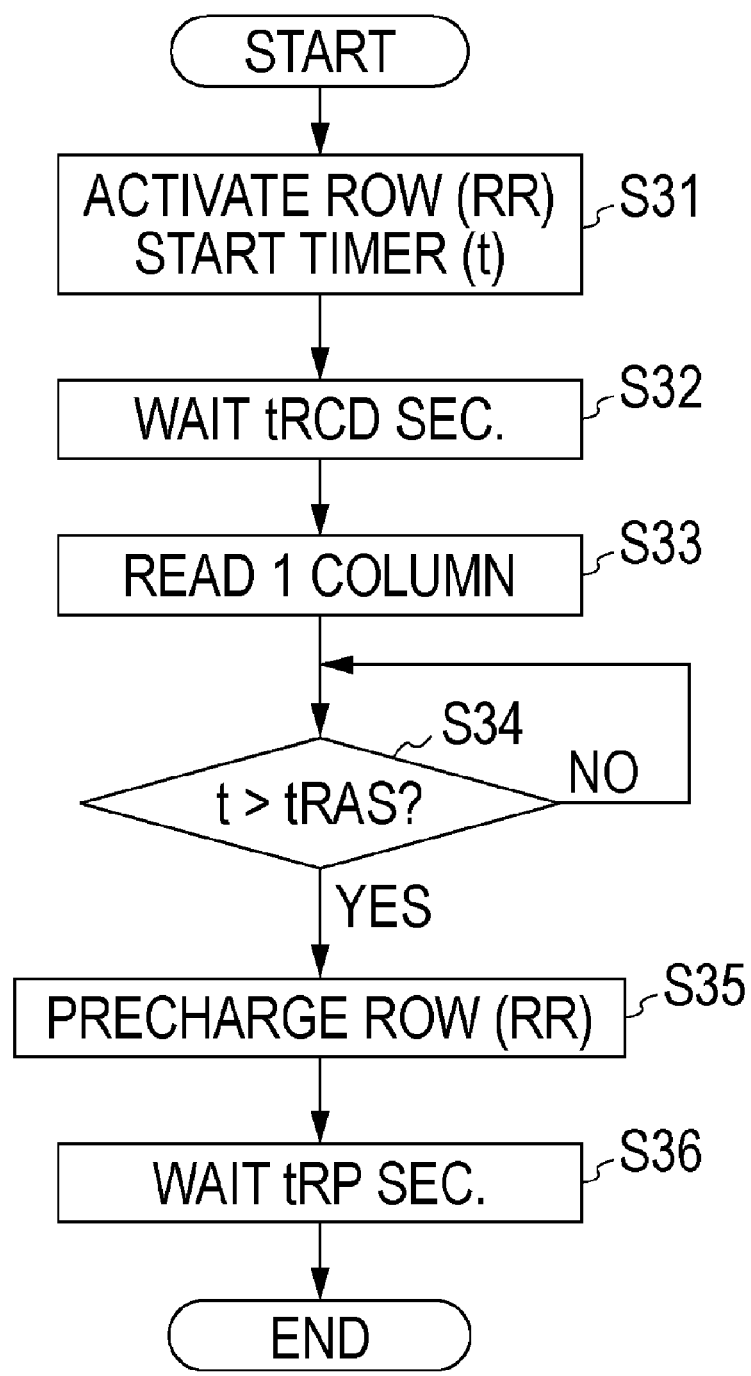
FIG. 8 is a diagram illustrating a refresh operation in a memory control section.

FIG. 8 is a diagram illustrating a refresh operation by the memory control section 141B in the DRAM 141 in the memory module 14 which received a refresh instruction.

The memory control section 141B activates a row to be refreshed RR and starts measuring a time t (S31).

The memory control section 141B waits for a prescribed time tRCD from the activation until a read operation becomes possible (S32) and reads data in the row to be refreshed RR (S33).

Then, the memory control section 141B waits for a prescribed time tRAS from the activation until a precharge operation becomes possible (S34) and performs a precharge operation (S35).

Next, the memory control section 141B waits for a prescribed time tRP from the precharge operation until a next operation becomes possible (S36) and finishes the refresh operation.

Figure 9:
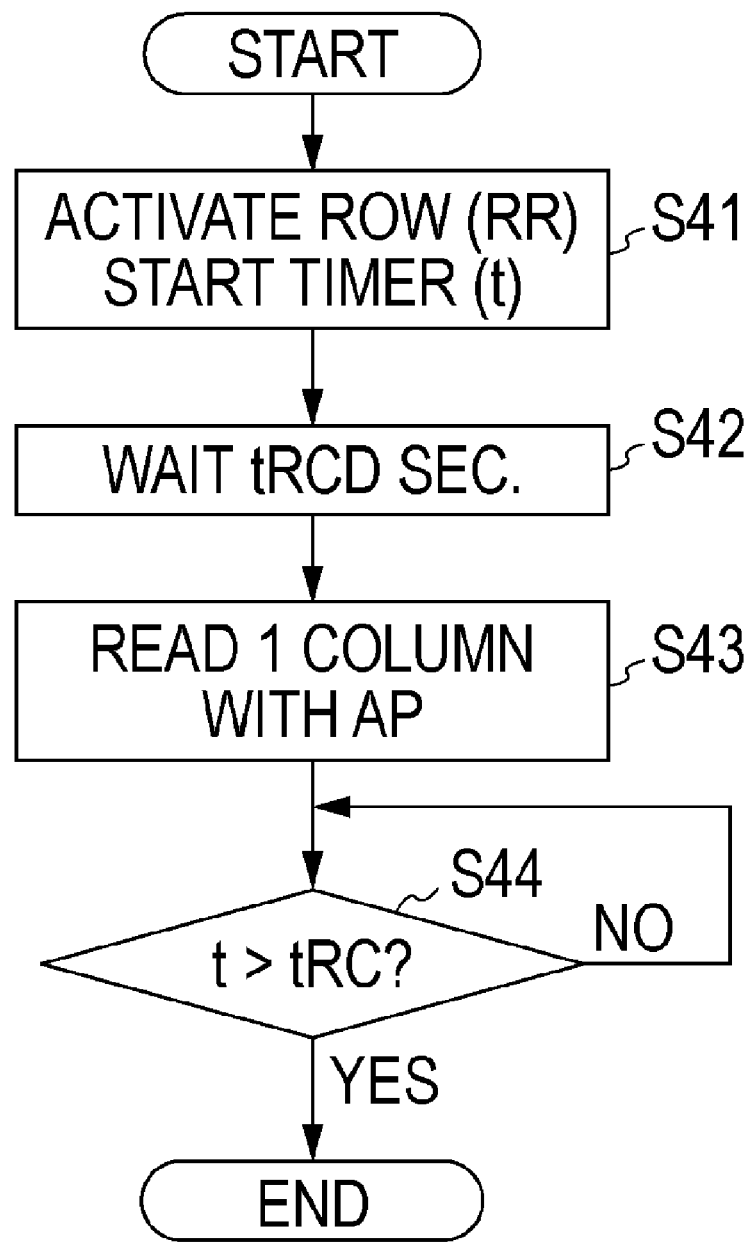
FIG. 9 illustrates another example of the refresh operation.

FIG. 9 is a diagram illustrating another example of a refresh operation. A refresh operation by the memory control section 141B may be performed as illustrated in FIG. 9 instead of as illustrated in FIG. 8.

The memory control section 141B activates a row to be refreshed RR and starts measuring the time t (S41).

The memory control section 141B waits for the prescribed time tRCD from the activation until a read operation becomes possible (S42) and reads data in a row to be refreshed RR and performs an automatic precharge operation (S43).

The memory control section 141B waits for the prescribed time tRC from the activation until the next row may be activated (S44) and finishes the refresh operation.

Figure 10:
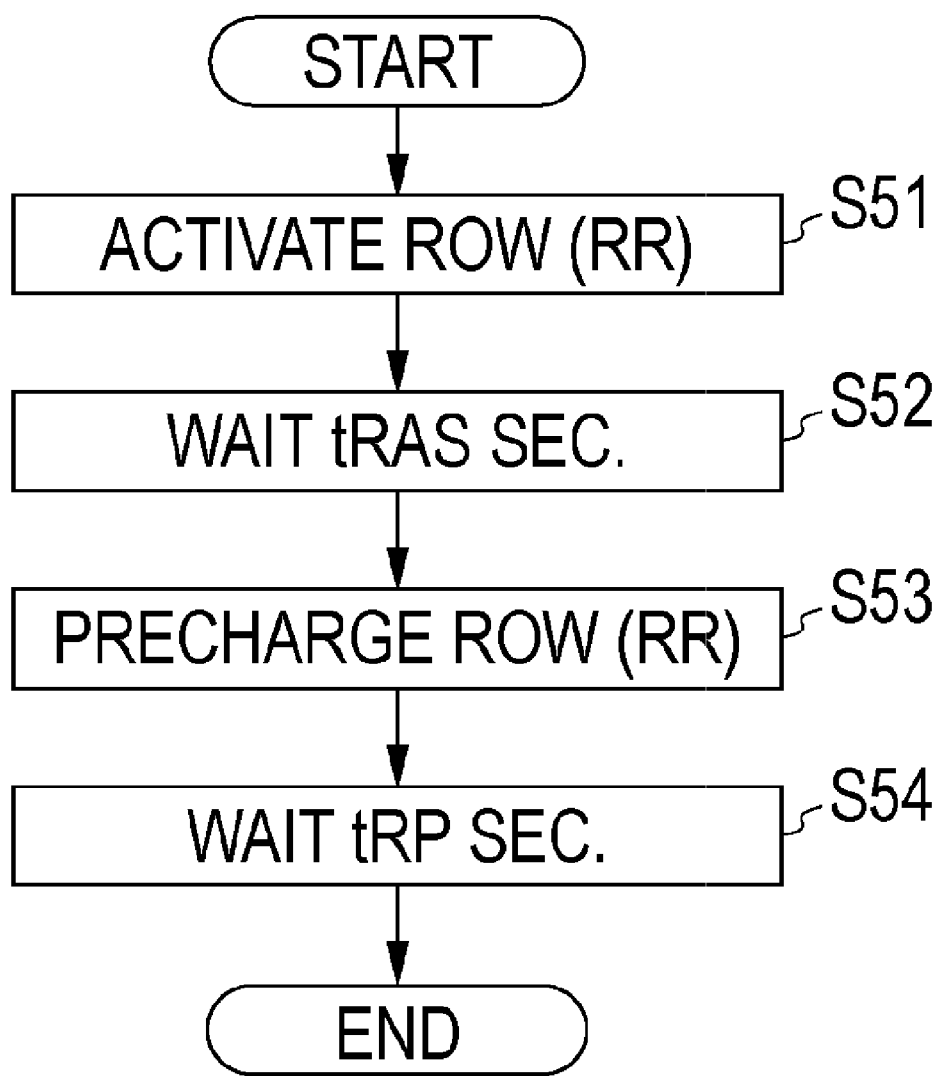
FIG. 10 illustrates another example of the refresh operation.

FIG. 10 is a diagram illustrating still another example of a refresh operation. A refresh operation by the memory control section 141B may be performed as illustrated in FIG. 10 instead of as illustrated in FIG. 8.

The memory control section 141B activates a row to be refreshed RR (S51).

The memory control section 141B waits for the prescribed time tRAS from the activation until a precharge operation becomes possible (S52) and performs a precharge operation (S53).

The memory control section 141B waits for the prescribed time tRP from the precharge operation until the next operation becomes possible (S54) and finishes the refresh operation.

Figure 11:
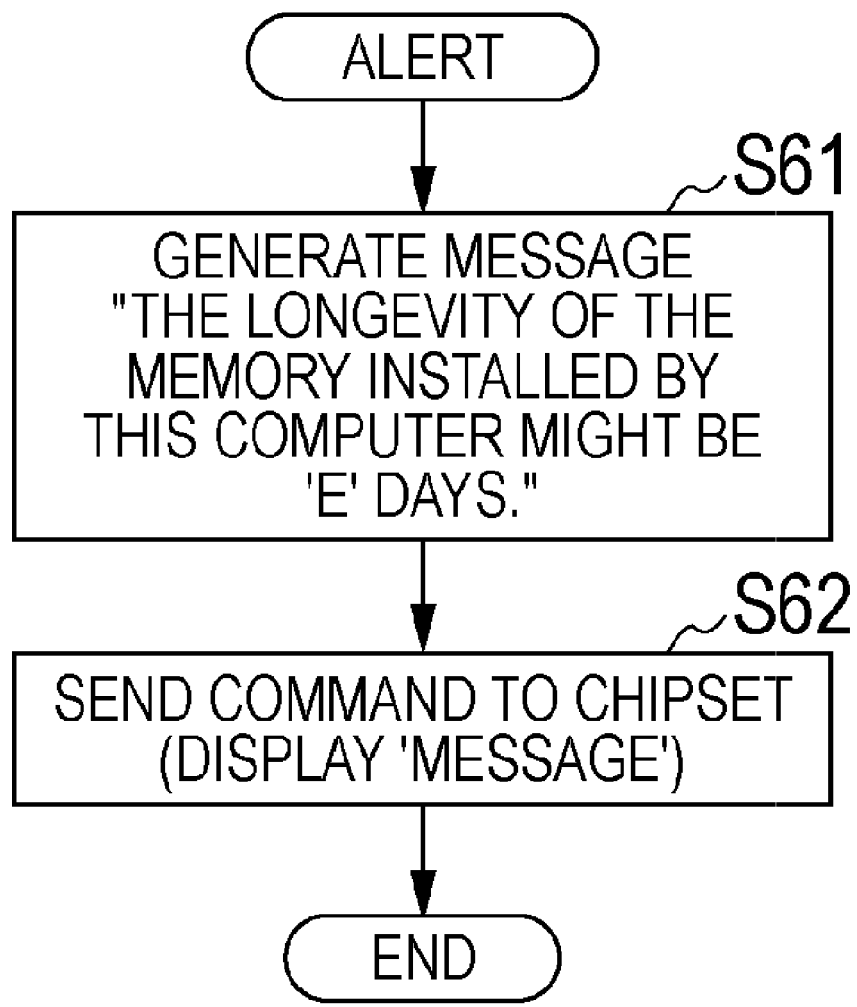
FIG. 11 is a diagram illustrating how to output a warning message to a display device.

FIG. 11 is a diagram illustrating how the warning section 24 outputs a warning message to the display device 15.

When the warning section 24 receives a notice of having reached the end of longevity from the longevity evaluation section 23 at S708 in FIG. 6, the warning section 24 reads a warning message, such as "The main memory of this computer has reached the end of longevity. Please replace the main memory and boot.", from the BIOS ROM 19 and generates a display command (S61).

The warning section 24 sends the display command to the chipset 11 to display on the display device 15 (S62).

Figure 12:
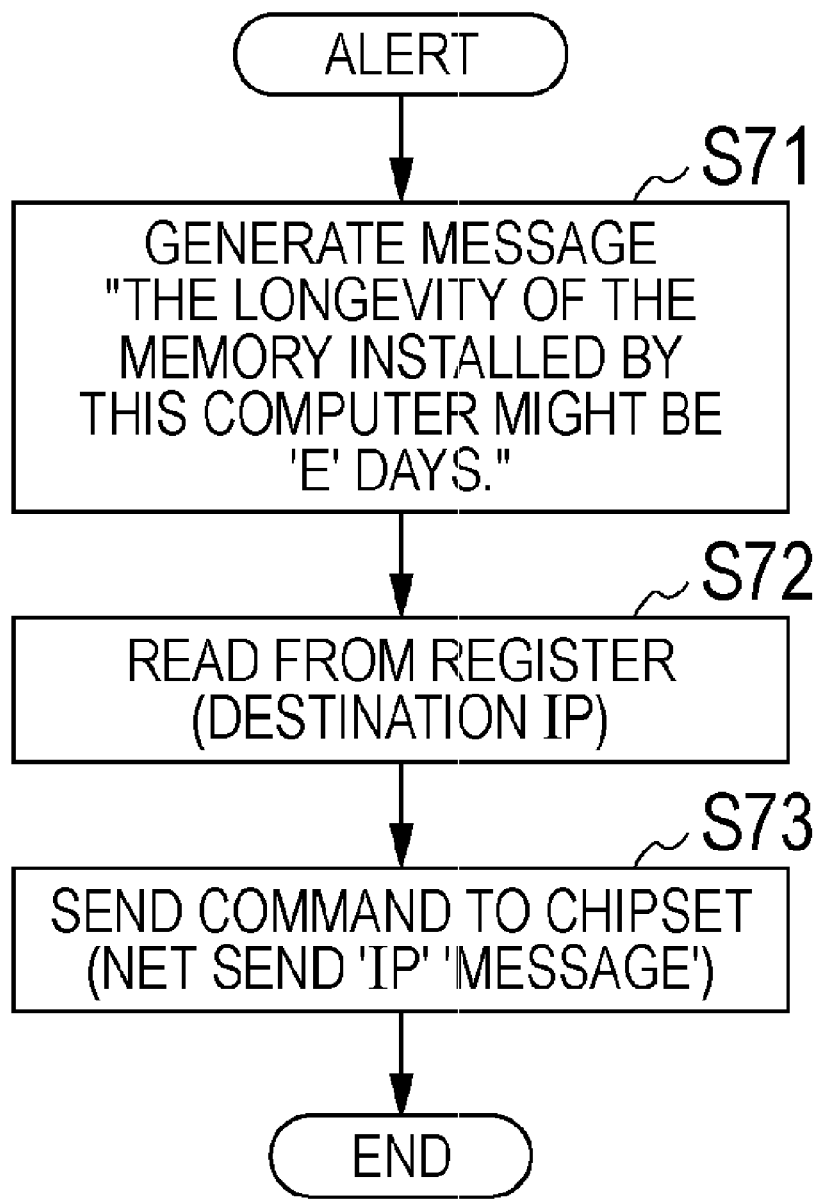
FIG. 12 is a diagram illustrating how to output a warning message to a predetermined IP address.

FIG. 12 is a diagram illustrating how the warning section 24 outputs a warning message to a predetermined IP address.

When the warning section 24 receives a notice of having reached the end of longevity from the longevity evaluation section 23 at S708 in FIG. 6, the warning section 24 reads a warning message, such as "The main memory of this computer has reached the end of longevity. Please replace the main memory and boot.", from the BIOS ROM 19 and generates a send command (S71).

The warning section 24 reads the predetermined IP address from the BIOS ROM 19 (S71), transmits the address to the chipset 12, and sends the warning message to the predetermined IP address via the LAN interface 16 (S72).

Figure 13:
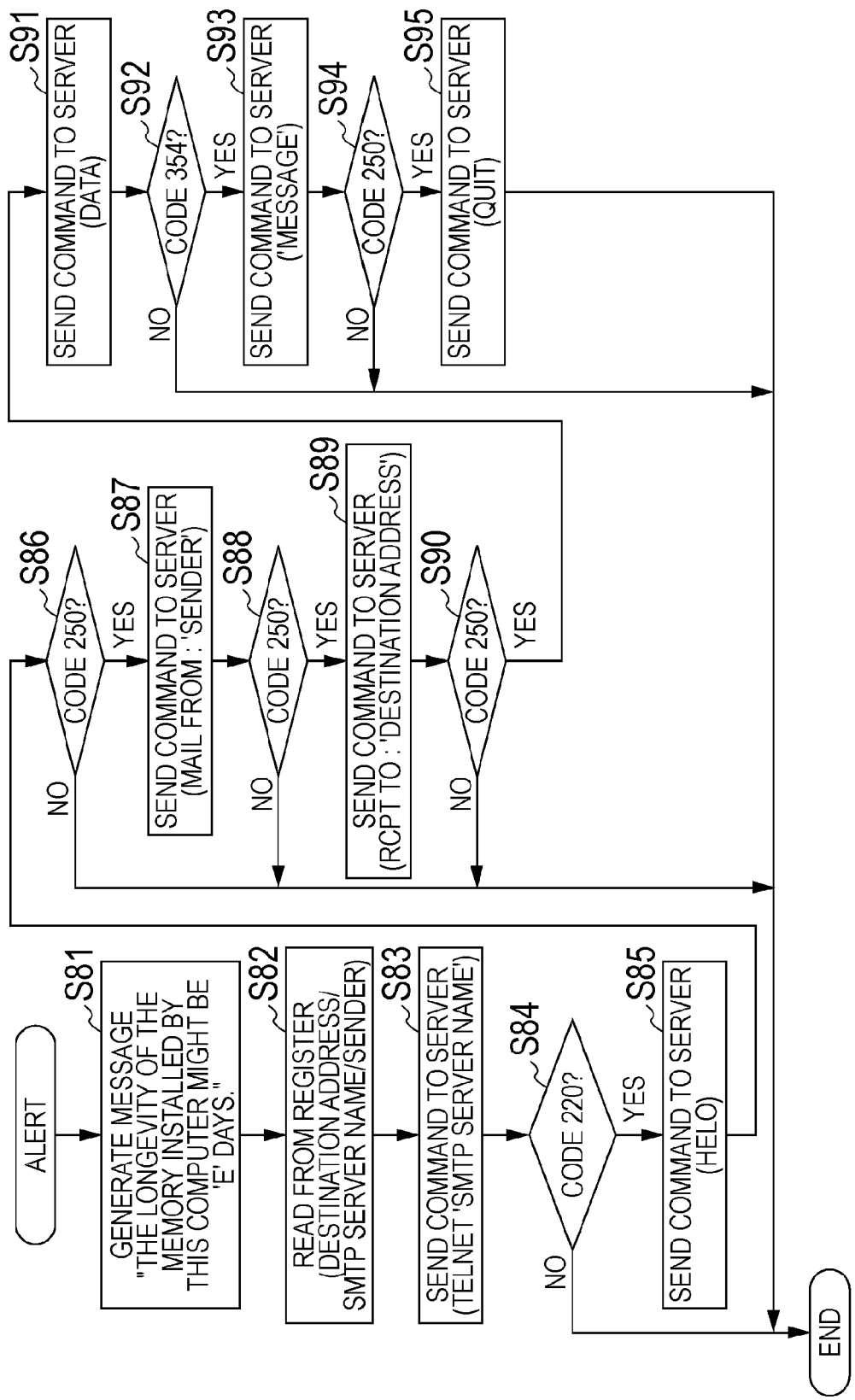
FIG. 13 is a diagram illustrating how to output a warning message to a predetermined e-mail address.

FIG. 13 is a diagram illustrating how the warning section 24 outputs a warning message to a predetermined e-mail address.

When the warning section 24 receives a notice of having reached the end of longevity from the longevity evaluation section 23 at S708 in FIG. 6, the warning section 24 reads a warning message, such as "The main memory of this computer has reached the end of longevity. Please replace the main memory and boot.", from the BIOS ROM 19 and generates a send command (S81).

The warning section 24 reads a predetermined destination mail address, information on a transmission server, and information on a sender from the BIOS ROM 19 (S82) and transmits a command to start transmission to the transmission server (S83). The warning section 24 sends a HELO command to the server (S85) when the server completes a preparation (S84: Yes), and sends the sender information to the server (S87) when the command is correctly processed (S86).

The warning section 24 sends the destination address to the server (S89) when the sender information is correctly processed (S88: Yes), and sends a command to start data transmission to the server (S91) when the destination address is correctly processed (S90: Yes). The warning section 24 sends a warning message (S93) when the server instructs to start sending data (S92: Yes), and sends a command to finish the process (S95) when the warning message is correctly processed (S94: Yes).

The longevity evaluation method illustrated in the above-described FIGS. 4 to 13 is performed at the time of booting, but is not limited thereto, and may be performed at other occasions, including at the time of termination and when an instruction for measurement is input by a user.

In addition, the initial retention time may be measured and set in advance to skip S5 and S6 in FIG. 4, and the longevity measurement at S7 may be performed after S4.

Moreover, in FIGS. 5 and 6, although the refresh processes S602, 604, 608, 610, 702, and 704 for rows other than rows to be measured are performed at intervals between processes for rows to be measured in the memory module 14, they are not limited thereto, and a refresh interval may be clocked at a loop other than that between processes for rows to be measured to generate an interruption at a predetermined cycle and perform the refresh process in FIG. 7.

In Embodiment 1, as described above, the longevity of the memory module 14, which is a DRAM, may be evaluated as illustrated in FIG. 6. When the end of longevity is reached, as illustrated in FIG. 6, since the OS is not booted, the reliability of the information processing system (longevity evaluation device) 1 is maintained.

In Embodiment 1, since a data retention time is calculated to evaluate the longevity on the basis of the data retention time, it is possible to evaluate that the end of longevity has been reached on the basis of the decrease in the data retention time accompanying the increase in the current carrying time of the memory module 14.

Moreover, in Embodiment 1, as illustrated in FIGS. 11 to 13, since the warning section 24 outputs a warning message, any method may be used to warn a user.

Figure 14:
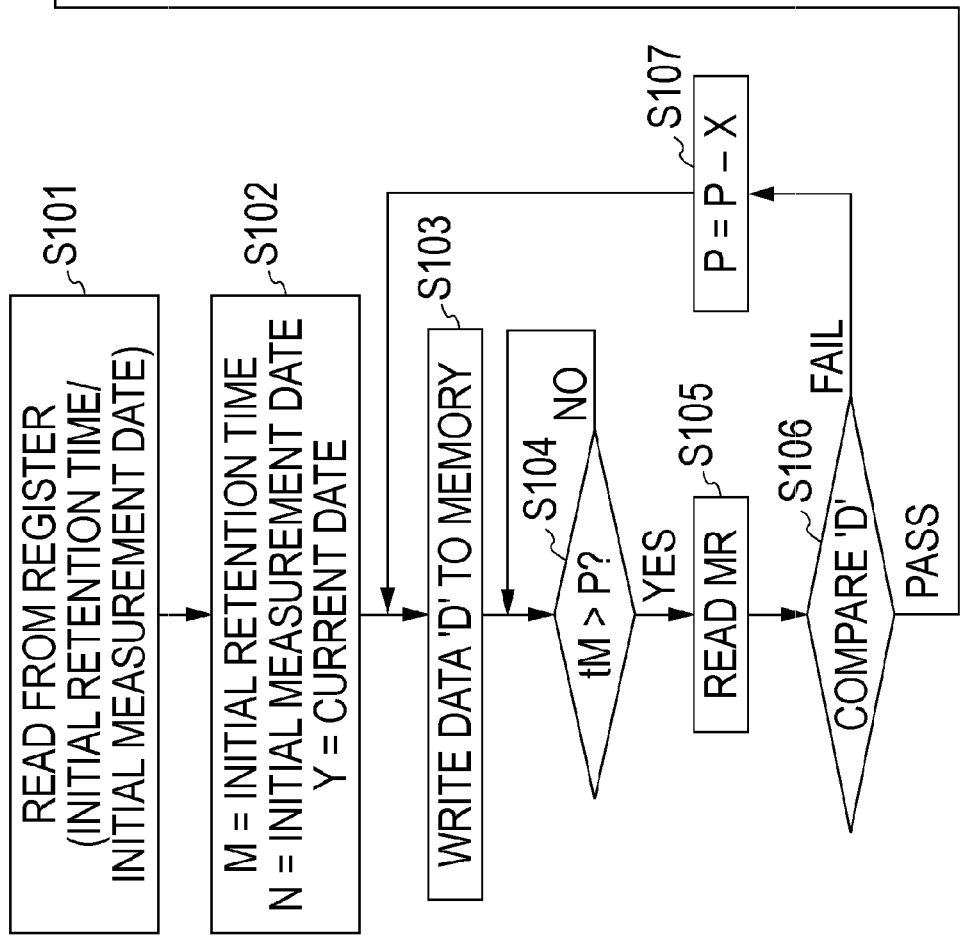
FIG. 14 is a diagram of a longevity evaluation method according to Embodiment 2.
Figure 15:
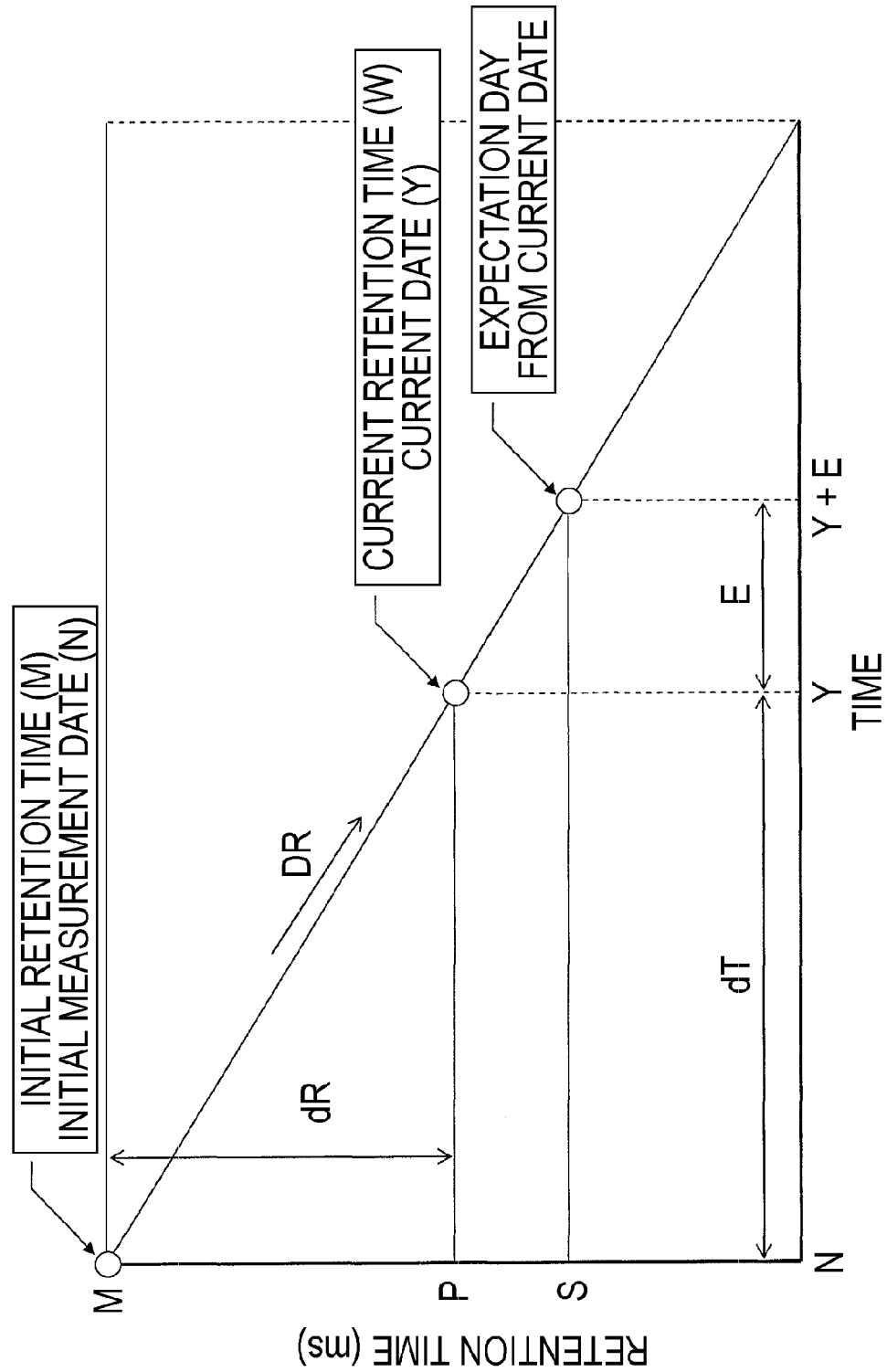
FIG. 15 is a diagram illustrating how to estimate a longevity according to Embodiment 2.

FIGS. 14 and 15 are diagrams illustrating how to estimate a longevity according to Embodiment 2. The method in Embodiment 1 evaluates whether or not the longevity has been reached. The method in Embodiment 2 is different in that remaining time before reaching the end of longevity is evaluated. Since other configurations are almost the same as those in Embodiment 1, the same reference numerals have been used for the same elements to avoid repeated explanation.

In Embodiment 2, a longevity evaluation section 23 starts processes illustrated in FIG. 14 when a predetermined time of measurement, such as the time of the boot or termination of a longevity evaluation device 1, is reached, or when an instruction for measurement is input by a user. At first, the longevity evaluation section 23 reads an initial retention time (a first data retention time) M and the measurement date of the data retention time from a BIOS ROM 19 and obtains a current date from a system timer 17 (S101).

The longevity evaluation section 23 substitutes the initial retention time into a variable M, the measurement date into a variable N, and the current date into a variable Y, respectively. In addition, an initial value of an elapsed time P is set to be the same as the initial retention time M (S102).

Next, a write section 26 writes data into a memory module 14 (S103). A read controlling section (read control section) 22 waits for the elapsed time P and reads data from the memory module 14 (S104 and 105).

The longevity evaluation section 23 compares the data written at S103 with the data read at S105 (S106), and when the data do not match, subtracts a predetermined decrement X from the elapsed time P and returns to S103.

The longevity evaluation section 23 repeats S103 to S107 until the data match at S103 and, when the data match, uses the elapsed time P as the current data retention time (a second data retention time), and subtracts the current data retention time P from the initial retention time M to calculate a difference dR. The longevity evaluation section 23 also subtracts a measurement date N from a current date Y to calculate a measurement period dT (S108).

Then, the longevity evaluation section 23 calculates a decreasing rate DR of the data retention time on the basis of the difference dR and the measurement period dT and computes the longevity from the decreasing rate. Specifically, the longevity evaluation section 23 divides the difference dR by the measurement period dT to calculate the decreasing rate DR of the data retention time with respect to elapsed days, in other words, a slope of the graph illustrated in FIG. 15. Then, the longevity evaluation section 23 subtracts the data retention time used as the minimum to maintain data from the current data retention time P to calculate a difference and divides the difference by the decreasing rate DR to estimate the number of days E before the end of longevity is reached (S109).

The warning section 24 outputs a warning message including the number of days E estimated at S109. For example, the warning section 24 generates a warning message, such as "The main memory of this computer may reach the end of longevity in E days" and "The remaining longevity of the main memory in this computer is about Y+E", and in the same manner as illustrated in FIGS. 11 to 13, outputs the warning message to a display device 15, a predetermined IP address, and a predetermined e-mail address (S110).

Although refresh processes other than that for a row to be measured are not illustrated in FIG. 14, in the same manner as illustrated in FIG. 6, the refresh process illustrated in FIG. 7 may be performed at intervals of steps to rows to be measured in the memory module 14 or a refresh process may be performed periodically.

According to Embodiment 2 as described above, the decreasing rate of the data retention time may be calculated from the difference between the first data retention time and the second data retention time and the measurement period to calculate the number of days before the end of longevity on the basis of the decreasing rate.

Figure 16:
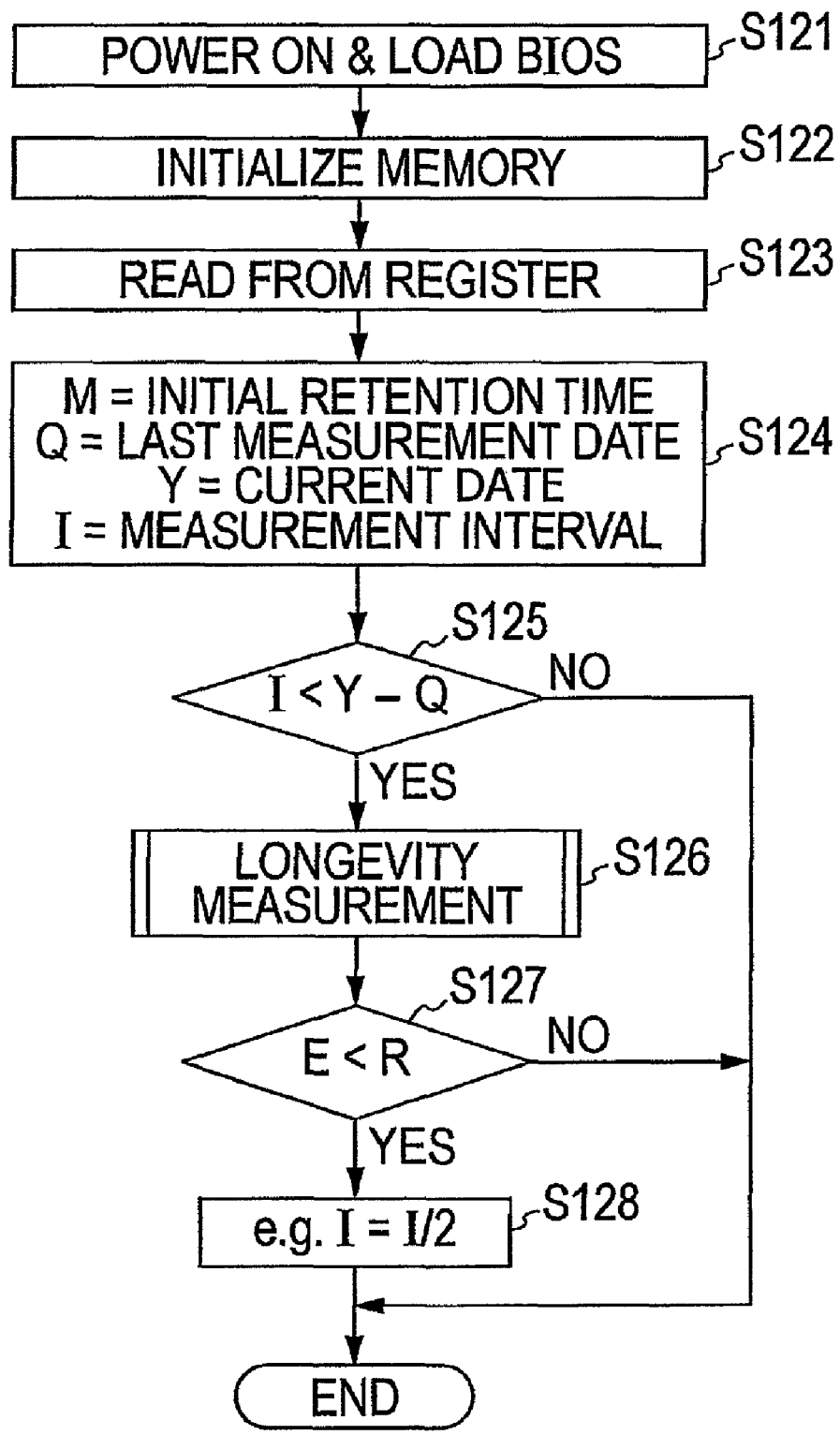
FIG. 16 is a diagram illustrating how to change a measurement interval according to Embodiment 3.

FIG. 16 is a diagram illustrating how to estimate a longevity and change a measurement interval according to Embodiment 3. In Embodiment 3, a longevity evaluation of Embodiment 2 is periodically performed at a predetermined time, and on the basis of the evaluated longevity, the time for detection is changed as the end of longevity approaches. Since other configurations are almost the same as those in Embodiment 2, the same reference numerals have been used for the same elements to avoid repeated explanation.

When a longevity evaluation device 1 is turned on, a CPU 13 reads a BIOS from a BIOS ROM 19 (S121) and initializes a memory module 14 (S122).

Next, the CPU 13 reads a latest measurement date, a current date, and a predetermined measurement interval from a predetermined storage section (S123). The storage section may include the BIOS ROM 19, an SPD ROM 142, a magnetic storage device 10, or a flash memory, such as a USB memory and a memory card (not illustrated). In this embodiment, data is stored in the BIOS ROM 19.

The CPU 13 substitutes the latest measurement date into a variable Q, the current date into a variable Y, and the measurement interval into a variable I (S124) and decides whether the number of elapsed days Y-Q between the latest measurement date Q and the current date Y has reached the predetermined measurement interval I (S125).

The CPU 13 ends the process without performing a longevity evaluation process when the number of elapsed days Y-Q has not reached the predetermined measurement interval I (S125: No) and performs a longevity evaluation process (S126) when the number of elapsed days Y-Q has reached the predetermined measurement interval I (S125: Yes). The longevity evaluation process S126 is the same as the process illustrated in FIG. 14 and calculates the number of days E before the end of longevity is reached.

The CPU 13 changes the measurement interval I to be smaller when the end of longevity is close on the basis of the evaluated longevity. For example, the CPU 13 decides whether the date E before the end of longevity is reached is smaller than a threshold value R (S127) and ends the process when the date E is not smaller than the threshold R (S127: No) and changes the measurement interval I (S128) when the date E is smaller than the threshold R (S127: Yes). In Embodiment 3, the measurement interval I is reduced to half the original value. The amount of change is not limited to half the original value and may be freely set. In addition, the threshold R as well as the measurement interval I may be changed at S128. For example, if the number of elapsed days Y-Q exceeds the threshold R when the threshold R is 200, the CPU 13 changes the measurement interval I and reduces the threshold R to half the original value.

According to Embodiment 3, the warning for longevity may be output appropriately because the longevity is periodically evaluated at the predetermined measurement interval I, and the detection is performed at a shorter interval as the end of longevity approaches.

The present invention is not limited to the examples illustrated in the drawings, but may be variously modified without departing from the technical scope thereof.

For example, the configurations described below may be used. These components may be combined where possible.

The above-described program may be stored in a computer readable storage medium. By reading the program from this storage medium, the computer will be able to provide the functions of the program.

A computer readable storage medium herein means a storage medium which may accumulate information including data and programs by an electric, magnetic, optical, mechanical, or chemical operation and which may be read from a computer. Such storage media which may be removed from a computer include flexible disks, magnetic-optical disks, CD-ROMs, CD-R/W disks, DVDs, DATs, 8 mm tapes, memory cards, and the like.

All examples and conditional language recited herein are intended for pedagogical purposes to aid the reader in understanding the embodiment and the concepts contributed by the inventor to furthering the art, and are to be construed as being without limitation to such specifically recited examples and conditions, nor does the organization of such examples in the specification relate to a illustrating of the superiority and inferiority of the embodiment. Although the embodiment(s) of the present invention has (have) been described in detail, it should be understood that the various changes, substitutions, and alterations could be made hereto without departing from the spirit and scope of the invention.

What is claimed is:

1. An information processing system comprising:
   a dynamic random access memory;
   a processor for information processing in cooperation with the dynamic access memory; and
   a built-in diagnosis module including a longevity evaluation device;
   the longevity evaluation device including:
      a timer for measuring an elapsed time after data is entered into a memory device;
      a read controller for reading the data from the memory device when the elapsed time reaches a predetermined time;
      an evaluator for evaluating a longevity of the memory device based on an existence of an error in the data read by the read controller and the elapsed time, the evaluator for calculating an initial retention time of the memory device when the read controller is able to read the data from the memory device without existence of the error; and a storage section for storing the initial retention time calculated of the memory device;

wherein the read controller reads the data from the memory device when the elapsed time reaches the predetermined time, the predetermined time obtained by subtracting a threshold from the initial retention time, and the evaluator evaluates the longevity of the memory device when the error of the data exists.

2. The information processing system according to claim 1, wherein the storage section includes a Basic Input Output System (BIOS) Read Only Memory (ROM) storing a program group (BIOS), a Serial Presence Detect (SPD) ROM, a magnetic storage device, or a flash memory.

3. The information processing system according to claim 1, wherein the evaluator includes a warning section for outputting a warning message when the evaluator evaluates the longevity of the memory device.

4. The information processing system according to claim 3, wherein the warning section outputs the warning message to a display device, a predetermined Internet Protocol (IP) Address, a predetermined mail address or the memory device.

5. The information processing system according to claim 1, wherein the evaluator calculates a first data detention time, calculates a second data detention time at a measurement interval after calculating the first data detention time, calculates a decreasing date based on a deference between the first data detention time decreased at the measurement interval and the measurement interval, and evaluates the longevity from the decreasing date.

6. The information processing system according to claim 5, wherein the evaluator periodically evaluates the longevity at a predetermined time, and changes the predetermined time on a basis of the longevity.

7. The information processing system according to claim 1, further comprising a refresh section for refreshing data of the memory device;

wherein the refresh section prohibits a refresh operation when the read controller is waiting to reach a predetermined time to read the data to evaluate the longevity.

8. A longevity evaluation method performed by using an information processing system, the information processing system including a dynamic random access memory, a processor for information processing in cooperation with the dynamic access memory, and a built-in diagnosis module including a longevity evaluation device, the method including:

measuring an elapsed time after data is entered into a memory device;

reading the data from the memory device when the elapsed time reaches a predetermined time;

evaluating a longevity of the memory device based on an existence of an error in the data and the elapsed time;

calculating an initial retention time of the memory device when the reading the data from the memory device is performed without existence of the error; and storing the initial retention time calculated of the memory device in a memory unit;

wherein the reading the data from the memory device is performed by reading the data from the memory device when the elapsed time reaches the predetermined time, the predetermined time obtained by subtracting a threshold from the initial retention time, and the evaluating the longevity of the memory device is performed when the error of the data exists.

9. The longevity evaluation method according to claim 8, wherein the storing the initial retention time calculated of the memory device in the memory unit is performed by using a Basic Input Output System (BIOS) Read Only Memory (ROM) storing a program group (BIOS), a Serial Presence Detect (SPD) ROM, a magnetic storage device, or a flash memory as the memory device.

10. The longevity evaluation method according to claim 8, wherein the evaluating the longevity of the memory device based on the existence of an error in the data read from the memory device and the elapsed time is performed by outputting a warning message by a warning section included in the evaluator when the evaluator evaluates the longevity of the memory device.

11. The longevity evaluation method according to claim 8, wherein the outputting the warning message by the warning section included in the evaluator when the evaluation evaluates the longevity of the memory device is performed by outputting the warning message to a display device, a predetermined Internet Protocol (IP) Address, a predetermined mail address or the memory medium.

12. The longevity evaluation method according to claim 8, wherein the evaluating the longevity of the memory device is performed by calculating a first data detention time, calculating a second data detention time at a measurement interval after calculating the first data detention time, calculating a decreasing date based on a deference between the first data detention time decreased at the measurement interval and the measurement interval, and evaluating the longevity from the decreasing date.

13. The longevity evaluation method according to claim 12, wherein the evaluating the longevity of the memory device is performed by periodically evaluating the longevity at a predetermined time, and changing the predetermined time on a basis of the longevity.

14. The longevity evaluation method according to claim 8, further comprising refreshing data of the memory device;

wherein the refreshing data of the memory device is performed by prohibiting a refresh operation when the read controller is waiting to reach a predetermined time to read the data to evaluate the longevity.

15. A longevity evaluation program stored in a non-transitory computer readable storage medium performed by an information processing system, the information processing system including a dynamic random access memory, a processor for information processing in cooperation with the dynamic access memory, and a built-in diagnosis module including a longevity evaluation device, the program comprising:

measuring an elapsed time after data is entered into a memory device;

reading the data from the memory device when the elapsed time reaches a predetermined time;

evaluating a longevity of the memory device based on an existence of an error in the data and the elapsed time;

calculating an initial retention time of the memory device when the reading the data from the memory device is performed without existence of the error; and storing the initial retention time calculated of the memory device in a memory unit;

wherein the reading the data from the memory device is performed by reading the data from the memory device when the elapsed time reaches the predetermined time, the predetermined time obtained by subtracting a threshold from the initial retention time, and the evaluating the longevity of the memory device is performed when the error of the data exists.

* * * * *